US012572264B2

(12) United States Patent
Noble et al.

(10) Patent No.: US 12,572,264 B2
(45) Date of Patent: Mar. 10, 2026

(54) GRAPHICAL USER INTERFACE FOR ARTIFICIAL INTELLIGENCE/MACHINE LEARNING (AI/ML) COGNITIVE SIGNALS ANALYSIS

(71) Applicant: Raytheon Company, Waltham, MA (US)

(72) Inventors: Joshua A. Noble, Altoona, PA (US); H. Brown Cribbs, III, Arlington, VA (US); Jacob M. Miller, State College, PA (US)

(73) Assignee: Raytheon Company, Arlington, VA (US)

( * ) Notice: Subject to any disclaimer, the term of this patent is extended or adjusted under 35 U.S.C. 154(b) by 1071 days.

(21) Appl. No.: 17/644,474

(22) Filed: Dec. 15, 2021

(65) Prior Publication Data

US 2023/0186104 A1     Jun. 15, 2023

(51) Int. Cl.
*G06F 3/0484* (2022.01)
*G01J 3/00* (2006.01)
(Continued)

(52) U.S. Cl.
CPC .............. *G06F 3/0484* (2013.01); *G01J 3/00* (2013.01); *G01R 23/16* (2013.01); *G06F 18/40* (2023.01);
(Continued)

(58) Field of Classification Search
CPC .......... G06N 3/105; G06N 3/08; G06N 20/00; G06F 18/40; G06F 3/0484; G06F 18/41;
(Continued)

(56) References Cited

U.S. PATENT DOCUMENTS 7,835,319 B2    11/2010  Sugar
9,367,743 B1    6/2016   Haglund et al.
(Continued)

FOREIGN PATENT DOCUMENTS

CN    109617845 A    4/2019
CN    109785361 A    5/2019
(Continued)

OTHER PUBLICATIONS

Nikhil Bhatia, Using Transfer Learning, Spectrogram Audio Classification, and MIT App Inventor to Facilitate Machine Learning Understanding, https://appinventor.mit.edu/assets/files/Nikhil_Bhatia_MEng_Thesis.pdf, Massachusetts Institute of Technology, May 2020 (Year: 2020).*

(Continued)

*Primary Examiner* — Nicholas Ulrich

(57) ABSTRACT

A method includes graphically presenting information defining one or more signals in a graphical user interface. The method also includes receiving, via the graphical user interface, an identification of (i) portions of the information defining the one or more signals that are associated with symbols contained in the one or more signals and (ii) labels for the symbols. The method further includes storing the identified portions of the information defining the one or more signals and the identified labels for the symbols as training data. In addition, the method includes receiving, via the graphical user interface, an identification of an artificial intelligence/machine learning (AI/ML) model and training the AI/ML model to predict the symbols using the training data.

20 Claims, 12 Drawing Sheets

(51) Int. Cl.

| | |
|---|---|
| *G01R 23/16* | (2006.01) |
| *G06F 18/40* | (2023.01) |
| *G06N 3/08* | (2023.01) |
| *G06N 3/10* | (2006.01) |

(52) U.S. Cl.
CPC ............... *G06N 3/08* (2013.01); *G06N 3/105* (2013.01); *G06F 2218/08* (2023.01)

(58) Field of Classification Search
CPC .... G01N 15/1433; G06V 10/82; G06V 10/70; G06V 10/98; G06V 10/987; G01R 23/16
See application file for complete search history.

(56) References Cited

U.S. PATENT DOCUMENTS

| | | | |
|---|---|---|---|
| 9,704,041 | B2 | 7/2017 | Haglund et al. |
| 11,853,401 | B1* | 12/2023 | Nookula ............. G06F 18/2163 |
| 2004/0202368 | A1 | 10/2004 | Lee et al. |
| 2018/0014217 | A1 | 1/2018 | Kleinbeck et al. |
| 2018/0300576 | A1 | 10/2018 | Dalyac et al. |
| 2019/0057274 | A1 | 2/2019 | Inaba |
| 2019/0073447 | A1 | 3/2019 | Guo et al. |
| 2019/0332893 | A1 | 10/2019 | Roy Chowdhury et al. |
| 2019/0347524 | A1 | 11/2019 | Znamenskiy et al. |
| 2019/0362022 | A1* | 11/2019 | Haukioja ................ G10L 15/04 |
| 2020/0151459 | A1 | 5/2020 | Farre Guiu et al. |
| 2020/0193604 | A1 | 6/2020 | Myronenko |
| 2020/0380304 | A1 | 12/2020 | Sallee et al. |
| 2021/0165817 | A1* | 6/2021 | Zeiler ...................... G06F 16/48 |
| 2022/0378377 | A1* | 12/2022 | Au .......................... G16H 40/63 |
| 2022/0390278 | A1* | 12/2022 | De Oliveira Correa ..................... H04L 67/12 |

FOREIGN PATENT DOCUMENTS

| | | |
|---|---|---|
| CN | 110113288 A | 8/2019 |
| EP | 3020006 B1 | 5/2021 |
| IN | 202044013227 A | 4/2020 |

OTHER PUBLICATIONS

Ketan Doshi, Audio Deep Learning Made Simple: Sound Classification, step-by-step, https://towardsdatascience.com/audio-deep-learning-made-simple-sound-classification-step-by-step-cebc936bbe5/, Mar. 18, 2021) (Year: 2021).*

Roccetti et al., "A Cautionary Tale for Machine Learning Design: why we Still Need Human-Assisted Big Data Analysis," Mobile Networks and Applications, Feb. 2020, 9 pages.

Wang et al., "Deep Learning for Signal Demodulation in Physical Layer Wireless Communications: Prototype Platform, Open Dataset, and Analytics," arXiv:1903.04297v1 [eess.SP], Mar. 2019, 8 pages.

Khalfi et al., "When Machine Learning Meets Compressive Sampling for Wideband Spectrum Sensing," IEEE, Jun. 2017, 6 pages.

O'Shea et al., "Learning Robust General Radio Signal Detection Using Computer Vision Methods," 2017 51st Asilomar Conference on Signals, Systems, and Computers, IEEE, Nov. 2017, 4 pages.

Shevitski et al., "Digital Signal Processing Using Deep Neural Networks," arXiv:2109.10404 [eess.SP], Sep. 2021, 21 pages.

Ma et al., "Signal Demodulation with Machine Learning Methods for Physical Layer Visible Light Communications: Prototype Platform, Open Dataset and Algorithms," arXiv:1903.11385v1 [eess.SP], Mar. 2019, 10 pages.

Roy et al., "Detection of Rogue RF Transmitters using Generative Adversarial Nets," 2019 IEEE Wireless Communications and Networking Conference (WCNC), IEEE, 2019, 7 pages.

Wei et al., "Blind Estimation of the PN Sequence of A DSSS Signal Using A Modified Online Unsupervised Learning Machine," MDPI Article, Sensors, 2019, 12 pages.

Davies et al., "Radio Frequency Machine Learning Systems (RFMLS)," Defense Advanced Research Projects Agency, May 2020, 2 pages.

"The Radio Frequency Spectrum + Machine Learning = A New Wave in Radio Technology," Defense Advanced Research Projects Agency, Aug. 2017, 4 pages.

Kasarla et al., "Region-Based Active Learning for Efficient Labeling in Semantic Segmentation," 2019 IEEE Winter Conference on Applications of Computer Vision (WACV), IEEE, Jan. 2019, 9 pages.

Caesar et al., "COCO-Stuff: Thing and Stuff Classes in Context," 2018 IEEE/CVF Conference on Computer Vision and Pattern Recognition, IEEE, Mar. 2018, 10 pages.

Benenson et al., "Large-scale interactive object segmentation with human annotators," arXiv:1903.10830v2 [cs.CV], Apr. 2019, 10 pages.

Olabarriaga et al., "Interaction in the segmentation of medical images: A survey," Medical Image Analysis, Jun. 2001, 16 pages.

Wigness, "SuperLabel: A Superpixel Labeling Interface for Semantic Image Annotation," U.S. Army Research Laboratory, ARL-TR-8514, Sep. 2018, 26 pages.

Christensson, "Buffer," Definition, TechTerms, Sharpened Productions, 2006, 1 page.

First Examination Report dated Aug. 28, 2020 in connection with Australian Patent Application No. 2020201897, 7 pages.

Agustsson et al., "Interactive Full Image Segmentation by Considering All Regions Jointly," arXiv:1812.01888v2 [cs.CV], Apr. 2019, 10 pages.

Andriluka et al., "Fluid Annotation: A Human-Machine Collaboration Interface for Full Image Annotation," arXiv:1806.07527v5 [cs.CV], Dec. 2018, 10 pages.

* cited by examiner

GRAPHICAL USER INTERFACE FOR ARTIFICIAL INTELLIGENCE/MACHINE LEARNING (AI/ML) COGNITIVE SIGNALS ANALYSIS

TECHNICAL FIELD

This disclosure relates generally to signal analysis systems. More specifically, this disclosure relates to a graphical user interface for artificial intelligence/machine learning (AI/ML) cognitive signals analysis.

BACKGROUND

Signal intelligence (SIGINT) generally refers to intelligence-gathering operations that occur through the interception and processing of electromagnetic signals or other signals. Ideally, intercepted signals can be demodulated, and symbol identification can occur in order to recover data contained in the intercepted signals. The recovered data may then be used for any suitable purposes. Similar types of operations may occur in a number of other signal analysis applications.

SUMMARY

This disclosure relates to a graphical user interface for artificial intelligence/machine learning (AI/ML) cognitive signals analysis.

In a first embodiment, a method includes graphically presenting information defining one or more signals in a graphical user interface. The method also includes receiving, via the graphical user interface, an identification of (i) portions of the information defining the one or more signals that are associated with symbols contained in the one or more signals and (ii) labels for the symbols. The method further includes storing the identified portions of the information defining the one or more signals and the identified labels for the symbols as training data. In addition, the method includes receiving, via the graphical user interface, an identification of an AI/ML model and training the AI/ML model to predict the symbols using the training data.

In a second embodiment, an apparatus includes at least one processing device configured to initiate graphical presentation of information defining one or more signals in a graphical user interface. The at least one processing device is also configured to receive, via the graphical user interface, an identification of (i) portions of the information defining the one or more signals that are associated with symbols contained in the one or more signals and (ii) labels for the symbols. The at least one processing device is further configured to initiate storage of the identified portions of the information defining the one or more signals and the identified labels for the symbols as training data. In addition, the at least one processing device is configured to receive, via the graphical user interface, an identification of an AI/ML model and train the AI/ML model to predict the symbols using the training data.

In a third embodiment, a non-transitory computer readable medium contains instructions that when executed cause at least one processor to initiate graphical presentation of information defining one or more signals in a graphical user interface. The medium also contains instructions that when executed cause the at least one processor to receive, via the graphical user interface, an identification of (i) portions of the information defining the one or more signals that are associated with symbols contained in the one or more signals and (ii) labels for the symbols. The medium further contains instructions that when executed cause the at least one processor to initiate storage of the identified portions of the information defining the one or more signals and the identified labels for the symbols as training data. In addition, the medium contains instructions that when executed cause the at least one processor to receive, via the graphical user interface, an identification of an AI/ML model and train the AI/ML model to predict the symbols using the training data.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
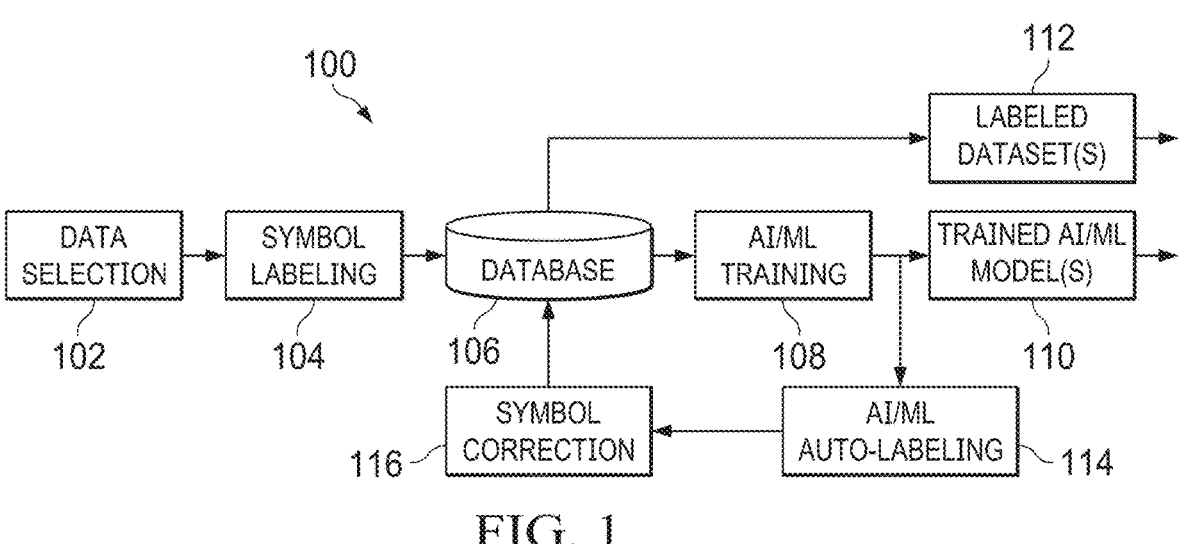
FIG. 1 illustrates an example architecture supporting a graphical user interface for artificial intelligence/machine learning (AI/ML) cognitive signals analysis according to this disclosure.

FIGS. 1 through 13, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, signal intelligence (SIGINT) generally refers to intelligence-gathering operations that occur through the interception and processing of electromagnetic signals or other signals. Ideally, intercepted signals can be demodulated, and symbol identification can occur in order to recover data contained in the intercepted signals. The recovered data may then be used for any suitable purposes. Similar types of operations may occur in a number of other signal analysis applications.

Artificial intelligence (AI) and machine learning (ML) techniques show promise in signal intelligence applications and other signal analysis applications, such as when AI/ML models can be trained and used to perform signal demodulation. However, performing symbol identification using an AI/ML model often involves the use of highly-curated datasets and trained neural networks for practical realization. Often times, training neural networks to make symbol predictions represents a process that is performed in a scripting environment and that has a steep learning curve. This can make it difficult, time-consuming, and costly to generate training datasets and to train AI/ML models in order to effectively perform symbol identification. Moreover, many signal analysts do not have a background in AI/ML and do not have adequate or detailed knowledge of how AI/ML models can be designed and trained.

This disclosure provides a graphical user interface-based approach for AI/ML cognitive signals analysis. As described in more detail below, a graphical user interface can be used to present a graphical representation of information defining one or more signals, such as a representation of information defining the signal(s) in the time and frequency domains. Functions can be invoked using the graphical user interface that allow one or more users to visually mark identified symbols within portions of the information defining the signal(s). The identified portions of the information defining the signal(s) can be stored along with their identified symbols, which represent labels for the identified portions of the signal(s). This allows the one or more users to build one or more training datasets for at least one AI/ML model to be trained.

The graphical user interface also allows the one or more users to build one or more AI/ML models, such as by using pre-defined building blocks. Once adequate training data is available and the structure of an AI/ML model is defined, the graphical user interface can be used to initiate training of the AI/ML model using at least one training dataset. Validation of the trained AI/ML model can occur, and the trained and validated AI/ML model can be placed into use. For instance, the trained and validated AI/ML model may be used to process information defining part of the one or more signals or one or more additional signals and to identify symbols contained in the analyzed information. The graphical user interface further supports an iterative process where incorrect predicted symbols generated by the trained AI/ML model can be corrected, and the corrected symbols can be used to update the training dataset(s) and to retrain the AI/ML model using the updated training dataset(s), which may now include the corrected symbols.

In this way, users are able to identify symbols in captured or other signals, initiate training of AI/ML models, use the trained AI/ML models to predict symbols, correct incorrect symbol predictions, and initiate retraining of the AI/ML models. Various ones of these steps may be performed iteratively. As a result, the users can quickly and easily both generate large AI/ML training datasets that are labeled and generate trained AI/ML models. The training datasets and trained models may be used locally or distributed to one or more destinations for storage or use. Thus, the graphical user interface can be used to support the creation of AI/ML training datasets and the creation and training of AI/ML models used for various signal processing applications that involve symbol identification. In some cases, this can be accomplished without requiring the users to understand the intricacies of AI/ML techniques.

Note that while the graphical user interface-based approach for AI/ML cognitive signals analysis is often described as being used for signal intelligence purposes, the graphical user interface-based approach may be used in any other suitable applications. For example, the graphical user interface-based approach may be used by governmental entities or other entities to perform spectrum monitoring or spectrum analysis, or the graphical user interface-based approach may be used to support cognitive radio communications. In general, the graphical user interface-based approach described in this patent document may be used in any suitable device or system to support the training of AI/ML models in order to perform symbol identification.

FIG. 1 illustrates an example architecture 100 supporting a graphical user interface for AI/ML cognitive signals analysis according to this disclosure. As shown in FIG. 1, the architecture 100 includes a data selection function 102, which generally operates to allow one or more users to select data to be further processed. For example, the data selection function 102 may cause a graphical user interface to present information defining one or more captured or other signals within a spectrogram window, where the spectrogram window provides a spectrogram of the signal(s). As a particular example, the one or more signals may be transformed, such as by applying a fast Fourier transform (FFT), and the spectrogram window may present spectrographic information defining the transformed version of the signal(s) in the time and frequency domains. The data selection function 102 may also use the graphical user interface to allow the one or more users to identify specific portions of the information defining the one or more signals, such as by allowing the user(s) to create boxes or other boundaries around regions of interest within the spectrogram window. Each region of interest may correspond to at least one symbol from the signal(s) to be subsequently identified. Example operations performed by the data selection function 102 are described in more detail below.

The architecture 100 also includes a symbol labeling function 104, which generally operates to allow one or more users to identify one or more specific symbols that are associated with each region of interest or other identified portion of the information defining the signal(s). For example, the symbol labeling function 104 may use the graphical user interface to allow the one or more users to graphically specify the location of each of one or more symbols within at least one identified portion of the spectrographic information in the spectrogram window and the value of each identified symbol. The value of each identified symbol may represent or be used as a label for the corresponding portion of the spectrographic information defining the signal(s) representing that symbol. The identified portions of the spectrographic information and their corresponding symbol labels can be stored in a database 106 or other storage location(s). Example operations performed by the symbol labeling function 104 are described in more detail below.

The architecture 100 further includes an AI/ML training function 108, which generally operates to (i) allow one or more users to specify a high-level structure of at least one AI/ML model to be built and how the AI/ML model(s) will be trained and (ii) initiate training of the AI/ML model(s) using specified training data. For example, the AI/ML training function 108 may use the graphical user interface to allow the one or more users to identify one or more pre-defined building blocks to be used to implement an AI/ML model and to identify training parameters to be used during training of the AI/ML model. The AI/ML training function 108 may also use the graphical user interface to allow the one or more users to initiate training of the defined AI/ML model, view the training results, and initiate validation of the trained AI/ML model. The AI/ML training function 108 may further use the graphical user interface to allow the one or more users to initiate storage, output, or use of one or more trained AI/ML models 110. For instance, the one or more trained AI/ML models 110 may be stored in a database (such as the database 106) or other suitable storage location(s) for subsequent use, or the one or more trained AI/ML models 110 may be provided to one or more external destinations for use in one or more signal processing tasks. Of course, the one or more trained AI/ML models 110 may also be used by the same device or system implementing the architecture 100 to perform one or more signal processing tasks. Note that the AI/ML models 110 here can have any suitable forms, such as neural networks, convolution neural networks (CNNs), deep neural networks (DNNs), or other AI/ML model structures. Similarly, the labeled data from the database 106 may be provided as one or more labeled datasets 112 to one or more external destinations for storage or use. For example, the one or more labeled datasets 112 may be provided to an external database or other suitable location(s) for storage, or the one or more labeled datasets 112 may be provided to an external system that is used to train other AI/ML models or that otherwise uses the labeled training data contained in the one or more labeled datasets 112. The one or more trained AI/ML models 110 and/or the one or more labeled datasets 112 may be used in any other suitable manner. Example operations performed by the AI/ML training function 108 are described in more detail below.

In addition, the architecture 100 supports an iterative model training process using an AI/ML auto-labeling function 114 and a symbol correction function 116. The AI/ML auto-labeling function 114 generally operates to use at least one trained AI/ML model 110 in order to generate symbols based on information defining at least a portion of the one or more signals used to generate previous training data or one or more additional signals. For example, the AI/ML auto-labeling function 114 may use the graphical user interface to allow the one or more users to initiate application of a trained AI/ML model 110 to at least a portion of information defining the one or more signals or one or more additional signals. The trained AI/ML model 110 can be used here to estimate the symbols contained in the analyzed information, and the AI/ML auto-labeling function 114 can present the predicted symbols that are estimated using the trained AI/ML model 110 to the one or more users. Example operations performed by the AI/ML auto-labeling function 114 are described in more detail below.

The symbol correction function 116 generally operates to allow the one or more users to make corrections to the predicted symbols that are generated by the AI/ML auto-labeling function 114. For example, the symbol correction function 116 may use the graphical user interface to allow the one or more users to identify at least one different symbol value for at least one of the predicted symbols generated by the AI/ML auto-labeling function 114. This correction may be needed, for instance, since the training of the AI/ML model 110 may not result in completely-accurate symbol estimations by the AI/ML model 110. The one or more users may also be given the option of storing the at least one different symbol value in the database 106 as part of at least one updated training dataset. If desired, the one or more users can initiate retraining of one or more AI/ML models 110 using the updated training dataset(s), and one or more retrained AI/ML models 110 may be produced. Example operations performed by the symbol correction function 116 are described in more detail below. This type of approach allows the one or more users to produce highly-accurate AI/ML models 110 and labeled datasets 112 over time.

Note that the various functions 102-104, 108, 114, 116 shown in FIG. 1 and described above may be implemented in any suitable manner. For example, in some embodiments, the functions 102-104, 108, 114, 116 shown in FIG. 1 may be implemented or supported using one or more software applications or other software/firmware instructions that are executed by at least one processor or other processing device. In other embodiments, at least some of the functions 102-104, 108, 114, 116 shown in FIG. 1 can be implemented or supported using dedicated hardware components. In general, the functions 102-104, 108, 114, 116 shown in FIG. 1 and described above may be performed using any suitable hardware or any suitable combination of hardware and software/firmware instructions.

Although FIG. 1 illustrates one example of an architecture 100 supporting a graphical user interface for AI/ML cognitive signals analysis, various changes may be made to FIG. 1. For example, various components in FIG. 1 may be combined, further subdivided, replicated, omitted, or rearranged and additional components may be added according to particular needs. Also, the various functions and storage devices shown in FIG. 1 and described above may be implemented using a single device or multiple devices that may or may not be geographically distributed. In addition, while shown as outputting both trained AI/ML models 110 and labeled datasets 112, the architecture 100 may be used to output only trained AI/ML models 110 or only labeled datasets 112 depending on particular needs.

Figure 2:
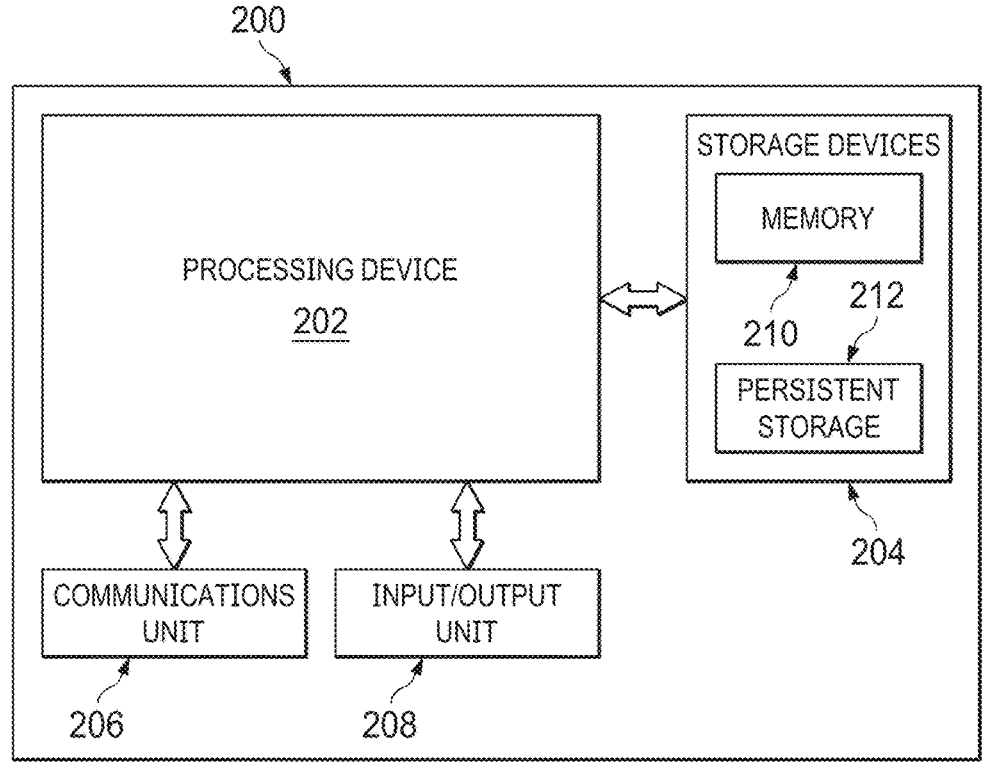
FIG. 2 illustrates an example device supporting a graphical user interface for AI/ML cognitive signals analysis according to this disclosure.

FIG. 2 illustrates an example device 200 supporting a graphical user interface for AI/ML cognitive signals analysis according to this disclosure. At least one instance of the device 200 may, for example, be used to implement at least a portion of the architecture 100 shown in FIG. 1 and described above. Note, however, that the architecture 100 may be implemented using any other suitable devices or systems. As a particular example, the architecture 100 may be implemented using multiple instances of the device 200, which may be positioned at or near the same general location or geographically distributed over a wide (and possibly very large) area.

As shown in FIG. 2, the device 200 may include at least one processing device 202, at least one storage device 204, at least one communications unit 206, and at least one input/output (I/O) unit 208. The processing device 202 may execute instructions that can be loaded into a memory 210. The processing device 202 includes any suitable number(s) and type(s) of processors or other processing devices in any suitable arrangement. Example types of processing devices 202 include one or more microprocessors, microcontrollers, digital signal processors (DSPs), application specific integrated circuits (ASICs), field programmable gate arrays (FPGAs), or discrete circuitry.

The memory 210 and a persistent storage 212 are examples of storage devices 204, which represent any structure(s) capable of storing and facilitating retrieval of information (such as data, program code, and/or other suitable information on a temporary or permanent basis). The memory 210 may represent a random access memory or any other suitable volatile or non-volatile storage device(s). The persistent storage 212 may contain one or more components or devices supporting longer-term storage of data, such as a read only memory, hard drive, Flash memory, or optical disc. In some embodiments, one or more of the storage devices 204 may be used to at least partially implement the database 106 of FIG. 1 and/or a local storage for the device 200.

The communications unit 206 supports communications with other systems or devices. For example, the communications unit 206 can include a network interface card or a wireless transceiver facilitating communications over a wired or wireless network. As particular examples, the communications unit 206 may be used to obtain information defining one or more captured signals or other signals to be analyzed, or the communications unit 206 may be used to provide one or more trained AI/ML models 110 and/or one or more labeled datasets 112. The communications unit 206 may support communications through any suitable physical or wireless communication link(s).

The I/O unit 208 allows for input and output of data. For example, the I/O unit 208 may provide a connection for user input through a keyboard, mouse, keypad, touchscreen, or other suitable input device. The I/O unit 208 may also send output to a display or other suitable output device, such as when presenting a graphical user interface to one or more users. Note, however, that the I/O unit 208 may be omitted if the device 200 does not require local I/O, such as when the device 200 represents a server or other device that can be accessed remotely.

In some embodiments, instructions are executed by the processing device 202 to implement the functionality of one or more of the functions 102-104, 108, 114, 116 shown in FIG. 1 and described above. For example, the instructions executed by the processing device 202 may cause the device 200 to present a graphical user interface to one or more users. The instructions executed by the processing device 202 may also cause the device 200 to receive user input identifying portions of information defining one or more signals, receive user input identifying symbols associated with the identified portions of the information defining the signal(s), and store the identified portions of the information and the identified symbols as labeled data in the database 106. The instructions executed by the processing device 202 may further cause the device 200 to receive user input defining the high-level structure of an AI/ML model and to initiate training of the AI/ML model using at least some of the labeled data in the database 106. In addition, the instructions executed by the processing device 202 may cause the device 200 to apply a trained AI/ML model 110 in order to generate predicted symbol labels, receive user input correcting one or more misidentified predicted symbol labels, and initiate storage of the corrected symbol labels in the database 106 and/or retraining of the AI/ML model using the corrected symbol labels.

Although FIG. 2 illustrates one example of a device 200 supporting a graphical user interface for AI/ML cognitive signals analysis, various changes may be made to FIG. 2. For example, computing and communication devices and systems come in a wide variety of configurations, and FIG. 2 does not limit this disclosure to any particular computing or communication device or system.

The following now describes a specific example implementation of a graphical user interface that can be used to support various functions of the architecture 100 described above. In general, the graphical user interface is used to load a signal dataset related to one or more signals, present the signal dataset in graphical form, allow one or more users to select portions of the signal dataset and identify symbols in those portions of the signal dataset, and store the portions of the signal dataset with the identified symbols as labels in a training dataset. The graphical user interface is also used to define the structure of at least one AI/ML model and initiate training of the AI/ML model(s) in order to generate one or more trained AI/ML models. The graphical user interface is further used to present predicted symbols generated using the trained AI/ML model(s), receive user input identifying corrections to one or more of the predicted symbols, initiate storage of the corrected symbols in an updated training dataset, and initiate retraining of at least one AI/ML model. The graphical user interface can therefore be used (among other things) to iteratively select training data, train one or more AI/ML models, perform auto-labeling, and correct symbol predictions so that users are able to generate large labeled training datasets and trained AI/ML models via the graphical interface.

Note that this example implementation of the graphical user interface is for illustration and explanation only and that other graphical user interfaces may be provided by or used with the architecture 100. For example, graphical user interfaces can easily vary in terms of the layout and arrangement of information within the graphical user interfaces and in terms of the specific I/O mechanisms (such as buttons, text boxes, dialog boxes, drop-down menus, tables, and graphs) used to provide information to or receive information from users. As a result, the scope of this disclosure is not limited to the specific implementation of the graphical user interface described below. For ease of explanation, the example implementation of the graphical user interface described below may be generated by at least one instance of the device 200 shown in FIG. 2 that supports the architecture 100 shown in FIG. 1. However, it should be noted that the implementation of the graphical user interface described below may be generated by any other suitable devices and in any other suitable systems.

Figure 3:
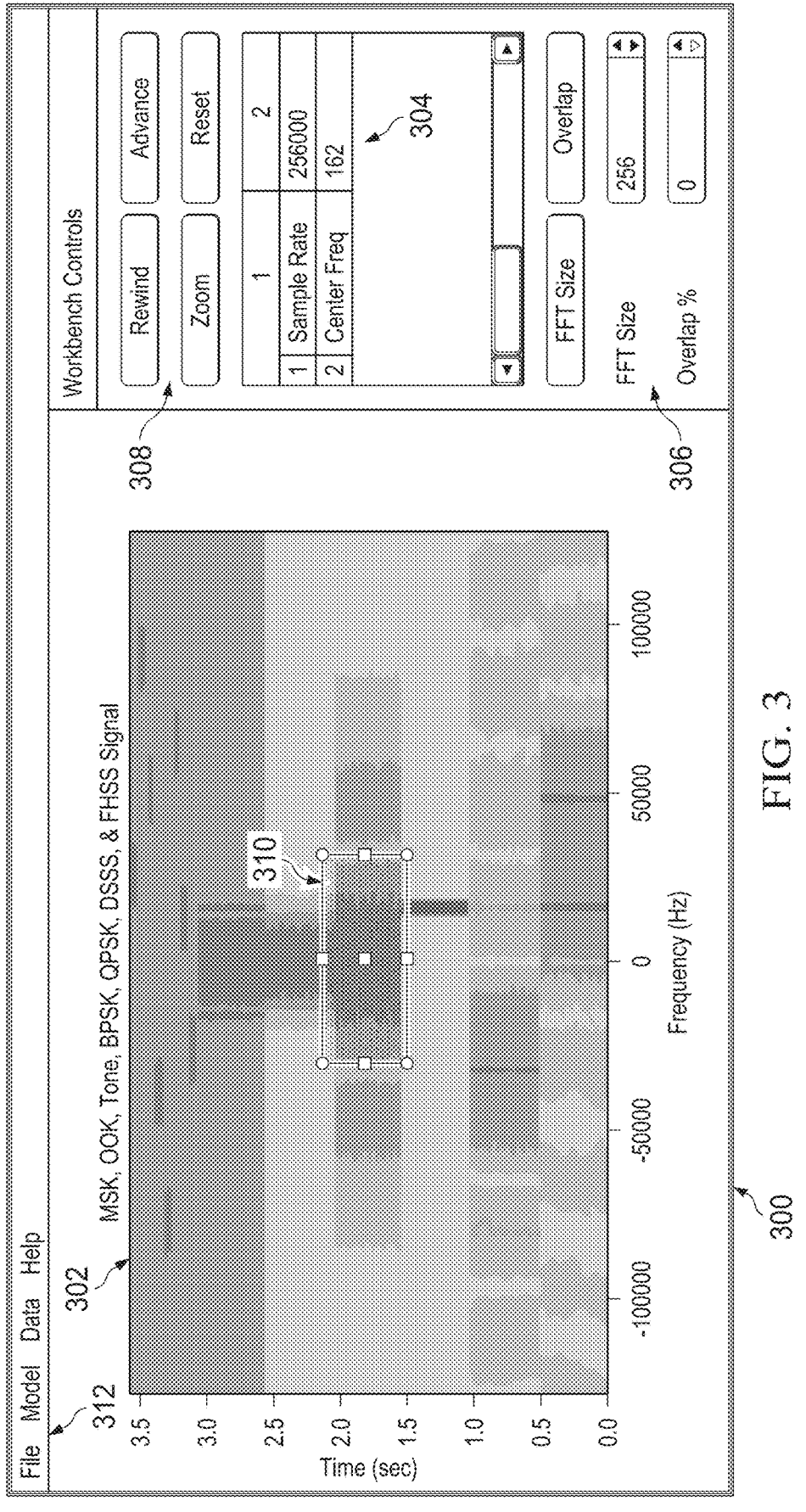
FIGS. 3 through 5 illustrate an example graphical user interface supporting a data selection function in the architecture of FIG. 1 according to this disclosure.
Figure 4:
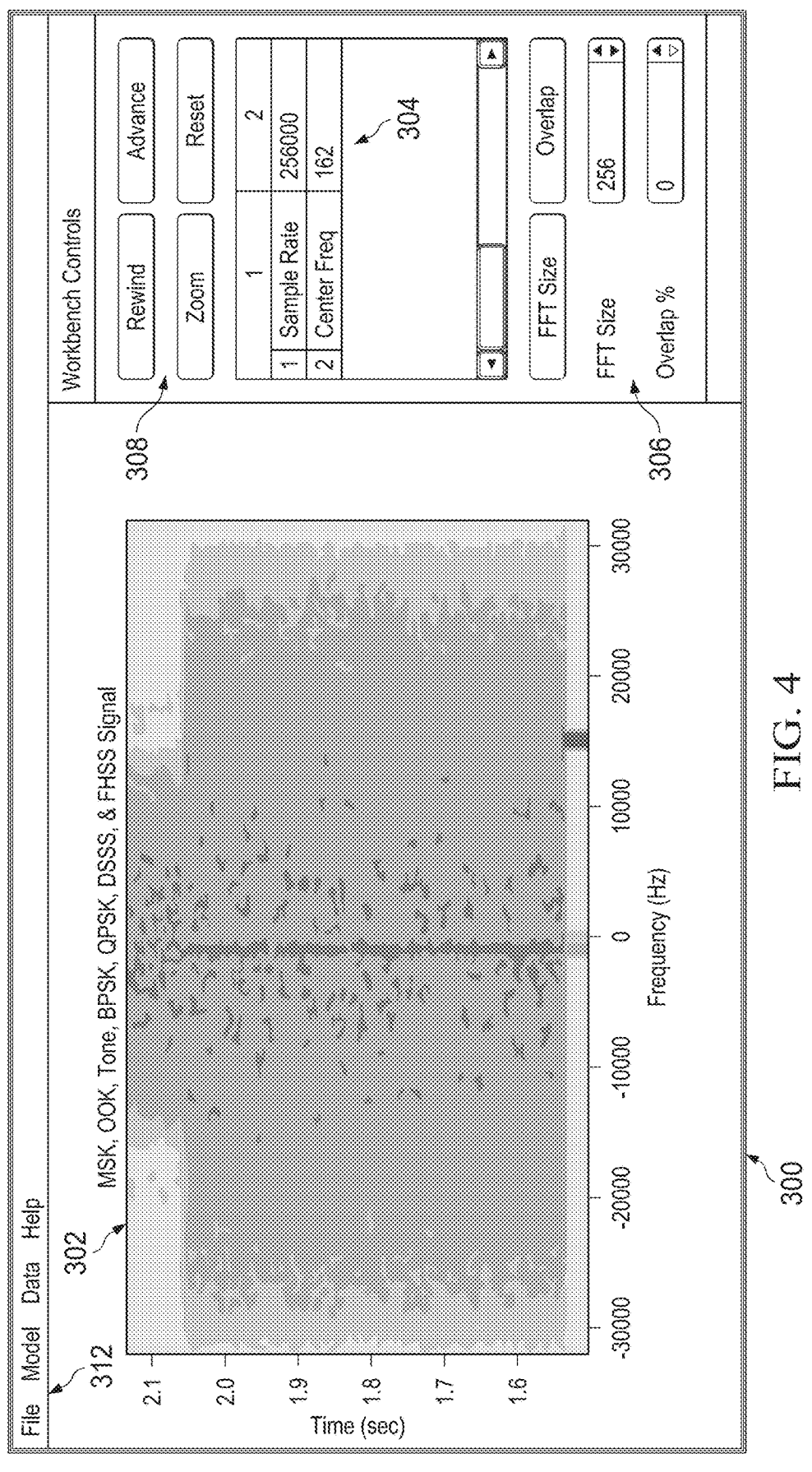
Figure 5:
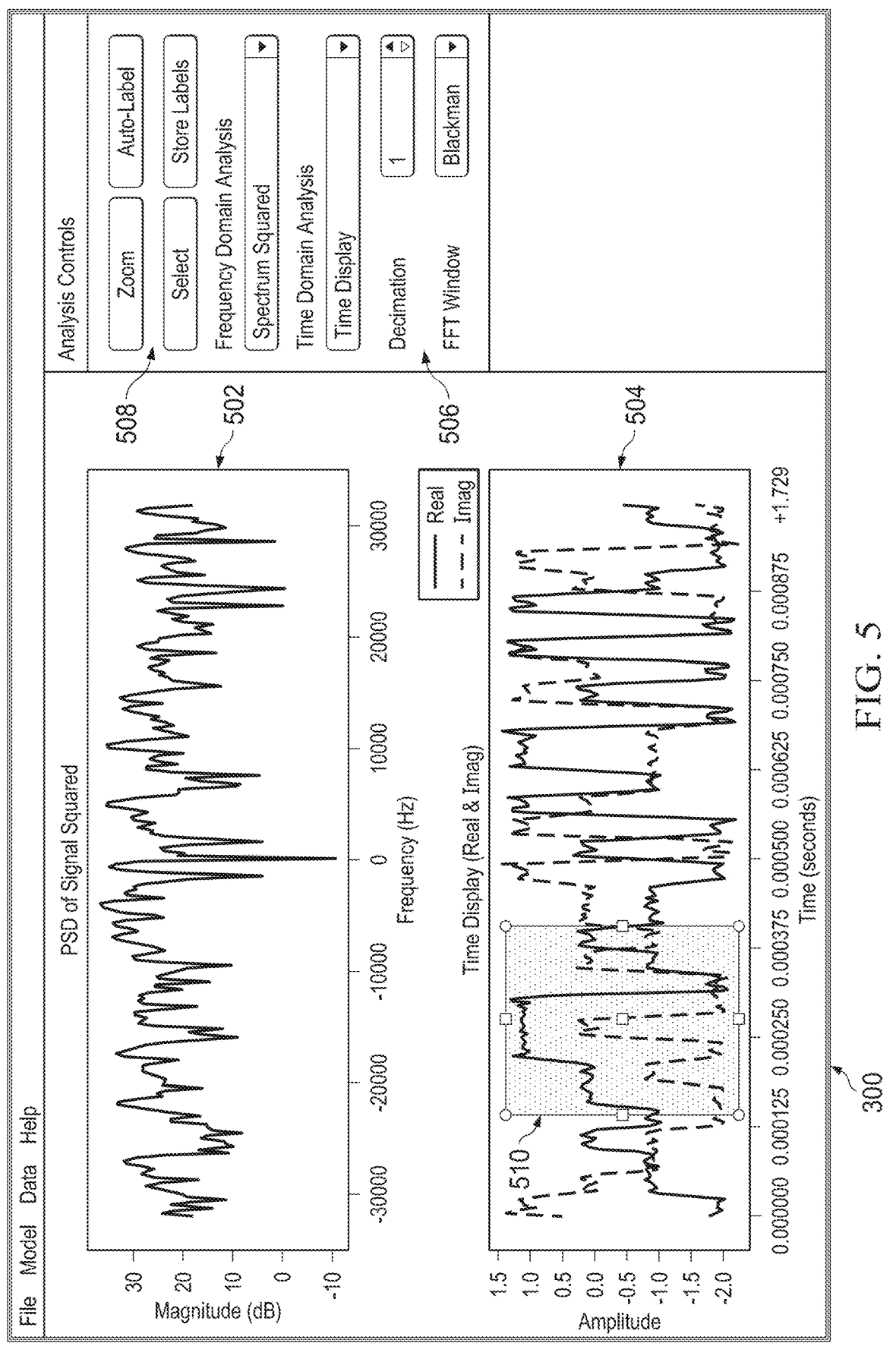

FIGS. 3 through 5 illustrate an example graphical user interface 300 supporting the data selection function 102 in the architecture 100 of FIG. 1 according to this disclosure. As shown in FIG. 3, the graphical user interface 300 includes a spectrogram window 302, which graphically presents spectrographic information defining one or more signals to be analyzed. Depending on the embodiment, the information defining the one or more signals may be generated by the same device that generates the graphical user interface 300 or by a different device. In some cases, the information defining the one or more signals may be imported from a data file or other source(s), such as when a user invokes an "open" or "import" function under the "File" option of a menu 312. Also, in some cases, the graphical user interface 300 may allow users to import testing or debugging information that simulate one or more signals. Note that the one or more signals here may represent any suitable signals to be analyzed, such as signals that use minimum shift keying (MSK), on-off keying (OOK), binary phase shift keying (BPSK), quadrature phase shift keying (QPSK), direct sequence spread spectrum (DSSS), frequency hopping spread spectrum (FHSS), or tone signals.

A table 304 in the graphical user interface 300 can present various metadata about the one or more signals being presented in the spectrogram window 302, such as the sample rate and carrier frequency of the one or more signals. Also, the user may select a point within the spectrogram window 302, such as by double-clicking on the selected point using a mouse or other pointing device, which may update the table 304 with the time and frequency coordinates of the selected point. Examples of this are shown in the table 304 of the graphical user interface 300 as presented in FIGS. 9 and 12.

Controls 306 in the graphical user interface 300 allow a user to change the FFT window size and the FFT spectrum overlap that are used to generate the contents of the spectrogram window 302. For example, the "FFT Size" control 306 may allow the user to specify the size of the spectrogram window 302 in pixels, and the "Overlap" control 306 may allow the user to specify the amount of spectrum overlap as a percentage. Also, controls 308 in the graphical user interface 300 allow the user to control the contents of the spectrogram window 302. For instance, the "Advance" and "Rewind" controls 308 allow the user to move forward or backward in time, which updates the spectrogram window 302 to show spectrographic information about the one or more signals at a different point in time. The "Reset" control 308 allows the user to reset the spectrogram window 302 to the initial point in time. In addition, the graphical user interface 300 allows the user to define a boundary 310 (such as a box) around a portion of the spectrographic contents of the spectrogram window 302 representing a region of interest, and the "Zoom" control 308 allows the user to zoom into that selected portion of the spectrogram window 302. FIG. 4 illustrates an example of the graphical user interface 300, where the spectrogram window 302 has been updated to present the contents of the zoomed-in portion of the spectrogram window 302 as defined by the boundary 310 of FIG. 3.

Figure 9:
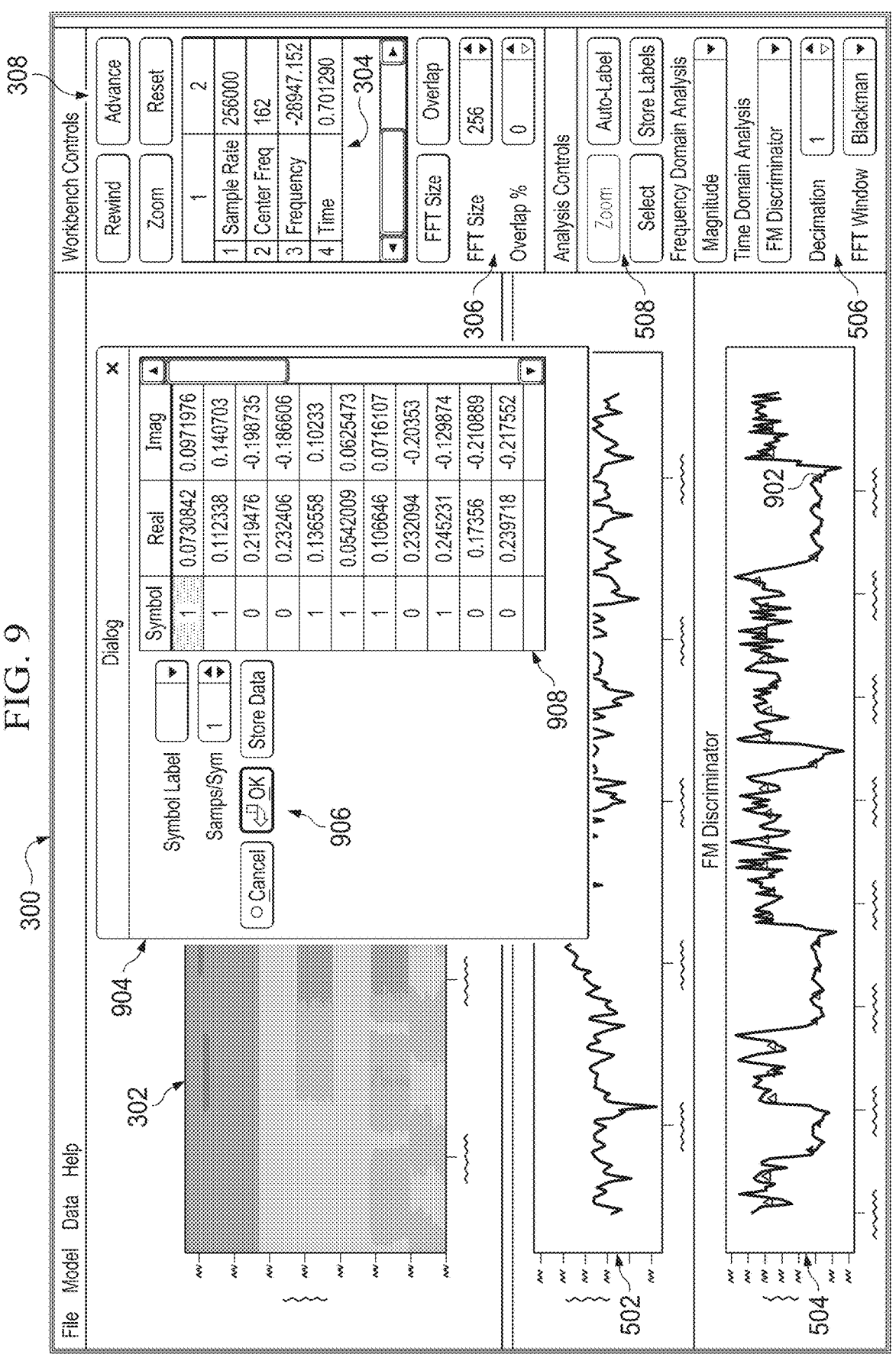
FIGS. 9 through 11C illustrate an example graphical user interface supporting an AI/ML auto-labeling function and a symbol correction function in the architecture of FIG. 1 according to this disclosure.
Figure 12:
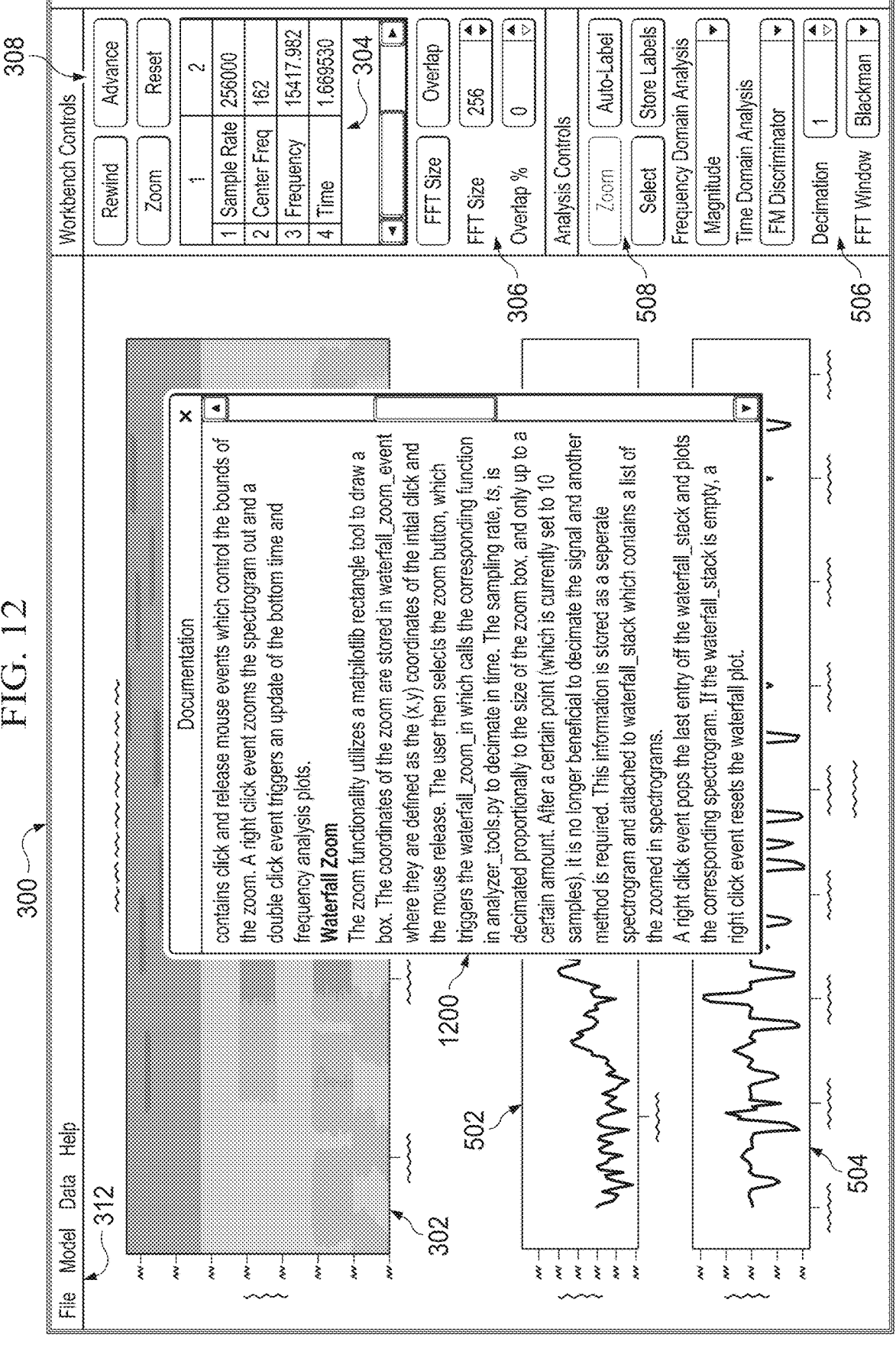
FIG. 12 illustrates an example documentation feature of a graphical user interface supporting the architecture of FIG. 1 according to this disclosure.

The spectrogram window 302 also allows the user to select a specific point within the spectrogram window 302, such as by allowing the user to double-click a mouse or other pointing device on a desired point within the spectrogram window 302. The selection of a specific point within the spectrogram window 302 causes the graphical user interface 300 to present one or more frequency and time analysis plots to the user, where the frequency and time analysis plots are associated with the selected point within the spectrogram window 302. An example of this is shown in FIG. 5, where two analysis plots 502 and 504 are shown in the graphical user interface 300. Controls 506 and 508 are also presented to the user in the graphical user interface 300. In some cases, the analysis plots 502 and 504 may be presented under the spectrogram window 302 within the graphical user interface 300, and the controls 506 and 508 may be presented under the controls 306 within the graphical user interface 300. One example of this is shown in FIGS. 9 and 12.

As shown in FIG. 5, the analysis plot 502 is used to present a selected frequency-domain analysis of the one or more signals at the selected point within the spectrogram window 302, and the analysis plot 504 is used to present a selected time-domain analysis of the one or more signals at the selected point within the spectrogram window 302. The controls 506 can be used to control which frequency-domain analysis and which time-domain analysis are generated and presented in the analysis plots 502 and 504. As particular examples, the controls 506 may allow the user to select from magnitude or power spectral density (PSD), spectrum squared, spectrum $4^{th}$, and spectrum conjugate squared for frequency analyses and to select from time display, phase, real, imaginary, frequency modulation (FM) discriminator, and IQ constellation for time analysis. In this particular example, the analysis plot 502 presents the power spectral density (squared) of the one or more signals at the selected point within the spectrogram window 302 over frequency. The analysis plot 504 presents the magnitude of real and imaginary components of the one or more signals at the selected point within the spectrogram window 302 over time. Note that the analysis plot 504 for the time-domain analysis may include baud lines, which may be used later to assist in identifying symbols.

Another control 506 can be used to decimate the information defining the one or more signals being analyzed at the selected point within the spectrogram window 302, which allows for downsampling of the signal(s). Another control 506 can be used to apply specific types of FFT windowing functions (such as Blackman, Hamming, Hann, or none) to the information defining the one or more signals at the selected point within the spectrogram window 302. The controls 508 allow the user to zoom into a selected portion of the analysis plot 504 after the user has drawn a boundary 510 (such as a box) around a portion of the contents of the analysis plot 504. Additional controls 508 can be used to generate symbol labels for the one or more signals, which is discussed in more detail below.

Using the graphical user interface 300 shown in FIGS. 3 through 5, one or more users can quickly and easily view spectrographic information defining one or more signals and other information associated with the one or more signals being analyzed, zoom into and out of the spectrographic information, and select specific portions of the spectrographic information. As described below, the selected portions of the spectrographic information may be labeled with symbol labels and used to create one or more training datasets.

In some embodiments, the spectrogram window 302 displays a falling raster scan that initially spans a sampling rate between $-f_s/2$ and $+f_s/2$ (where $f_s$ represents the sampling frequency used to sample the one or more signals being analyzed). The size of the spectrogram window 302 (such as in pixels) can be controlled using the "FFT Size" control 306. The current spectrogram presented in the spectrogram window 302 can be computed from a current time slice in the input signal dataset. The "Advance" and "Rewind" controls 306 can pull the next or former time slice and auto-redraw the spectrogram presented in the spectrogram window 302, and the "Reset" control 306 can return to the first time slice in the signal dataset. In some cases, the sampling rate is assumed to be fixed, and changing the number of FFT bins changes the scaling of the frequency window as $$df = \frac{1}{len(\text{time})}.$$

Each display spectrogram may represent stacked power spectral densities computed as:

$$PSD = 20 \, \log_{10}(|FFT(\{E(t)\}|)$$

In some embodiments, the user may define a rectangular box or other boundary 310 within the spectrogram window 302, such as by using a drag-and-drop function. This defines the boundary 310 within the spectrogram window 302, where the boundary 310 is associated with four corner coordinates that define the start/stop times and the frequencies associated with the selected portion of the spectrogram window 302. In some cases, the four coordinates and the corresponding start/stop times and frequencies can be stored as an array. Upon selection of the "Zoom" control 308, a new spectrogram can be presented in the spectrogram window 302, and the new spectrogram may be generated by center-tuning the one or more signals based on the boundary 310 and convolving a low-pass filter (such as a 2000 Hz roll-off filter with Kaiser-Order filter taps) with the windowing function that is selected in the "FFT Window" control 506. The tuning frequency can represent the center of the defined boundary 310.

In some cases, the zooming capability of the graphical user interface 300 provides the user with increased spectrogram resolution by truncating the amount of data within a PSD or other slice while keeping the FFT bin resolution (Hertz per bin) the same. This can be achieved by decimating the one or more signals, such as decimation up to a factor of ten. By decimating the signal(s) and holding the number of FFT bins constant, this effectively reduces the sampling rate, thereby increasing the bin resolution. If the user zooms multiple times, the device 200 may store each previous spectrogram, which allows the user to return to one or more previous spectrogram views. In particular embodiments, the user may return to the immediately-preceding spectrogram using a right-click of a pointing device, or the user may return to the initial spectrogram using the "Reset" control 308.

In some embodiments, the user may select a point within the spectrogram window 302, which causes the device 200 to identify the time associated with the selected point. The device 200 also isolates a specified number of I/Q data points after or around the selected point and uses this time slice to generate the analyses contained in the frequency and time analysis plots 502 and 504. The frequency analysis plot 502 can display the FFT spectrum of the time slice that is based on the selected point within the spectrogram window 302. The bounds of the frequency analysis plot 502 can be controlled by the boundary 310 in the spectrogram window 302 based on the number of FFT bins. If no zoom is selected, the bounds of the frequency analysis plot 502 can range from $-f_s/2$ to $+f_s/2$. Also, the time analysis plot 504 can display time-based data for the time slice that is based on the selected point within the spectrogram window 302. The graphical user interface 300 also allows the user to define a rectangular box or other boundary 510 within the time analysis plot 504, such as by using a drag-and-drop function. This defines the boundary 510 within the time analysis plot 504, where the boundary 510 is associated with four corner coordinates. In some cases, the four coordinates can be stored as an array. Upon selection of the "Zoom" control 508, an enlarged portion of the time-based analysis is presented in the time analysis plot 504. In some embodiments, the enlarged portion of the time-based analysis may be generated by spanning the selected portion of the prior time analysis plot 504. If the user zooms multiple times, the device 200 may store each previous time analysis, which allows the user to return to one or more previous time analysis views. In some embodiments, the user may return to the immediately-preceding time analysis using a right-click of a pointing device.

Figure 6:
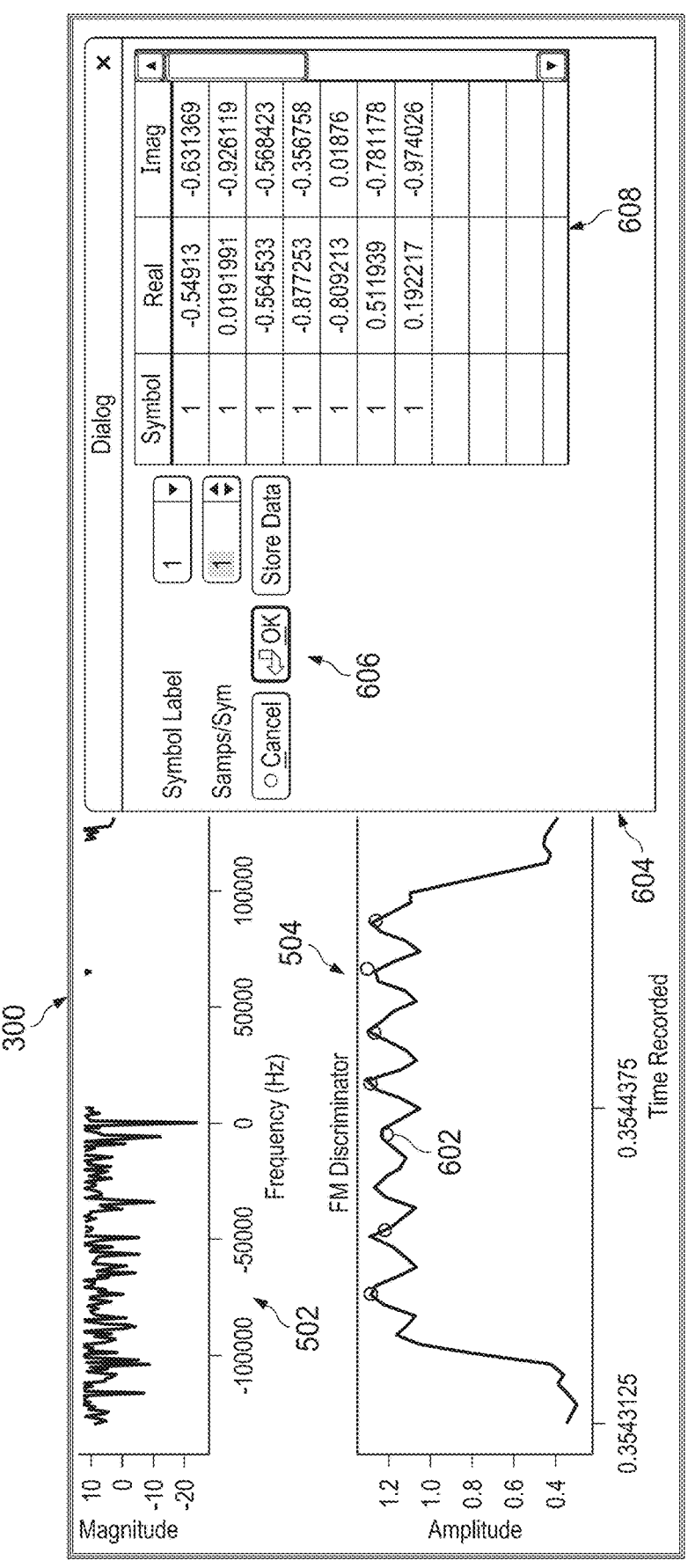
FIG. 6 illustrates an example graphical user interface supporting a symbol labeling function in the architecture of FIG. 1 according to this disclosure.

FIG. 6 illustrates the example graphical user interface 300 supporting the symbol labeling function 104 in the architecture 100 of FIG. 1 according to this disclosure. As shown in FIG. 6, after the user defines a boundary 510 in the time analysis plot 504 to specify a region of interest (or otherwise identifies a region of interest) and clicks the "Select" control 508, the graphical user interface 300 allows the user to click on or otherwise select one or more specific points within the time analysis plot 504. Each selected point within the time analysis plot 504 defines the approximate location of a symbol associated with that portion of the signal(s) being analyzed. For example, selecting a point within the time analysis plot 504 may cause the device 200 to identify the closest time point and one or more corresponding I/Q samples associated with that time point. Each selected point within the time analysis plot 504 may be identified using a hollow marker 602 presented within the time analysis plot 504.

A dialog box 604 may also be presented to the user, such as in response to the user selecting the "Store Labels" control 508 after selecting one or more points within the time analysis plot 504. In this example, the dialog box 604 includes controls 606 and a table 608. The controls 606 allow the user to select a symbol label to be assigned to one or more of the defined markers 602 and to identify the number of signal samples associated with each defined marker 602. The table 608 can present information associated with the one or more defined markers 602, such as by presenting the symbol value and the real and imaginary components of the one or more signals at each location associated with a defined marker 602. The user may also clear one or more of the markers 602, such as by right-clicking on the marker(s) 602, which removes the information about the one or more markers 602 from the table 608. While the controls 606 here may allow for symbol labels of zero and one, the controls 606 may be easily expanded to support multi-bit symbols. The "Cancel" control 606 allows the user to go back and mark additional symbols within the time analysis plot 504, the "OK" control 606 clears the marked symbols, and the "Store Data" control 606 saves the marked symbols, such as locally in a suitable file, as at least part of a training dataset. In some cases, the "Data" option of the menu 312 may allow the user to store the training data elsewhere, clear the locally-stored training data, load locally-stored training data, or store or load the training dataset to or from the database 106.

In some embodiments, when the user clicks on or otherwise selects a point within the time analysis plot 504, the device 200 identifies the closest time point and corresponding I/Q samples as discussed above. The device 200 then passes the I/Q samples through the correct time display option (such as real, phase, etc.) to generate (x, y) plot coordinates so that a hollow marker 602 can be plotted at that location. The closest time points, corresponding I/Q samples, and plot coordinates can be stored in an array. If the "Store Labels" control 508 is selected, the I/Q samples can be displayed in the table 608 and stored in a training dataset.

Using the graphical user interface 300 shown in FIG. 6, one or more users can graphically identify the symbol labels for one or more signals being analyzed. This allows the one or more users to quickly and easily generate labeled training data that can be stored in the database 106 and used to train one or more AI/ML models.

Figure 7:
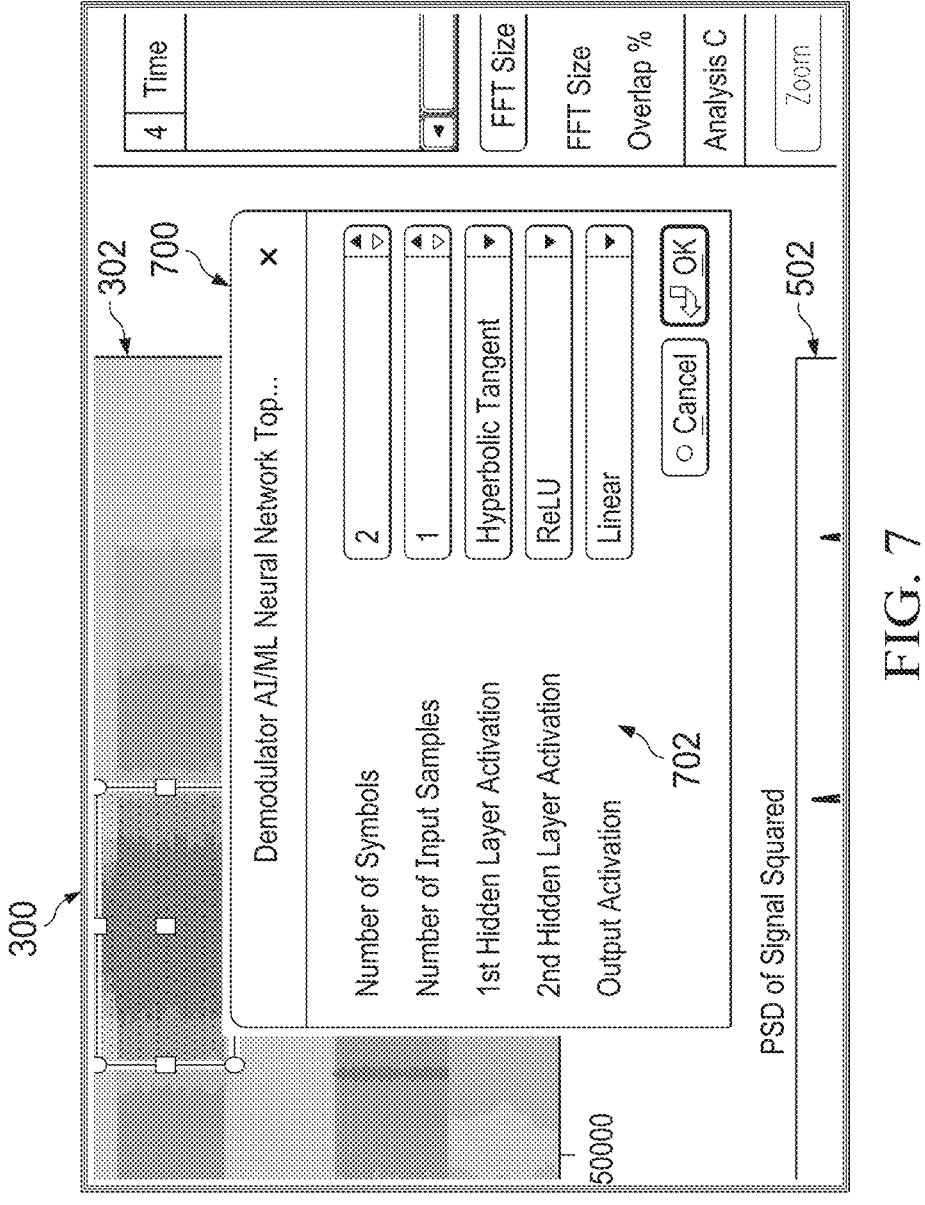
FIGS. 7 and 8 illustrate an example graphical user interface supporting an AI/ML training function in the architecture of FIG. 1 according to this disclosure.
Figure 8:
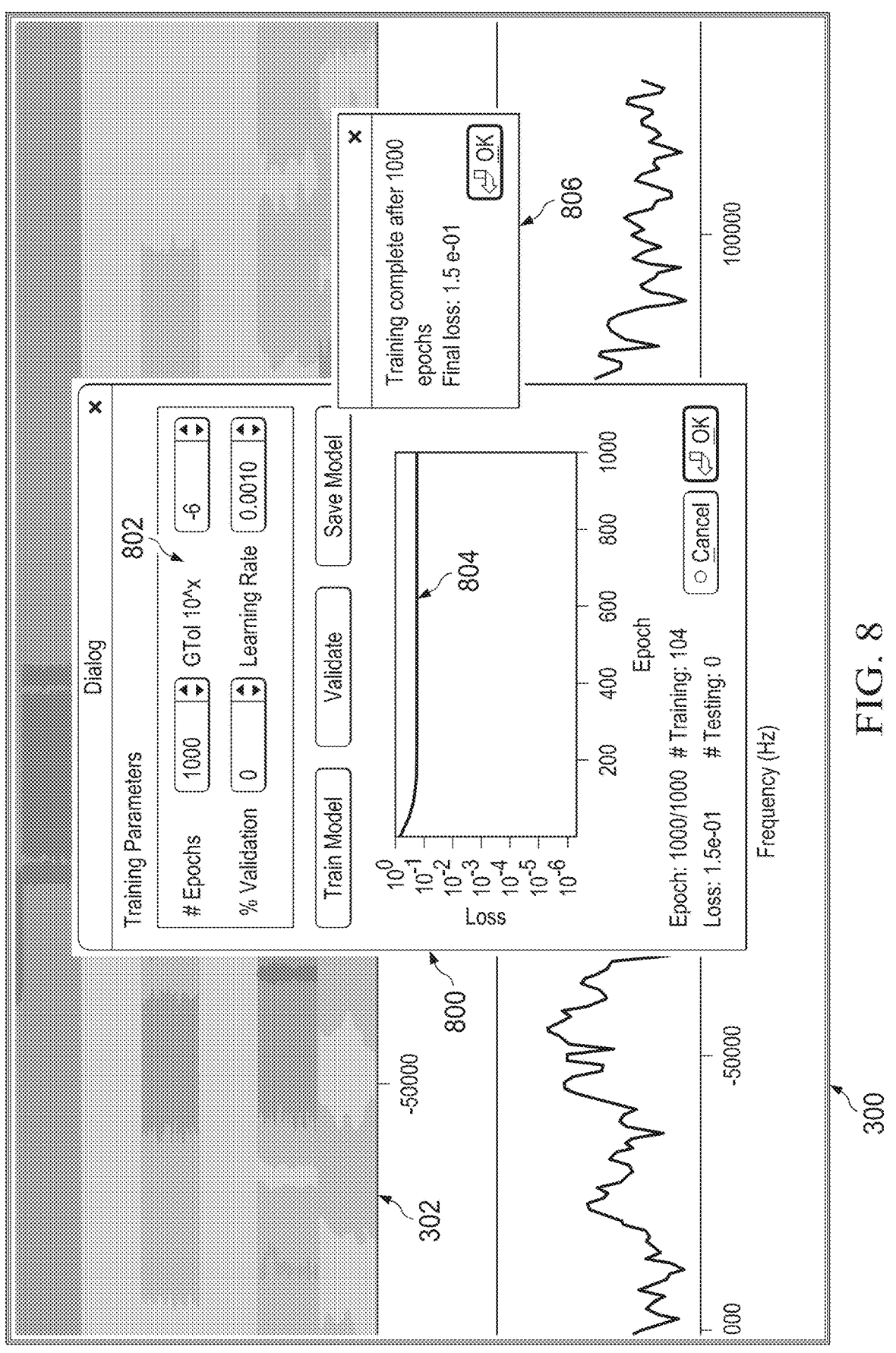

FIGS. 7 and 8 illustrate the example graphical user interface 300 supporting the AI/ML training function 108 in the architecture 100 of FIG. 1 according to this disclosure. As shown in FIG. 7, the user can use the graphical user interface 300 to define the high-level structure of at least one AI/ML model to be trained, such as when the user invokes a "change topology" function under the "Model" option of the menu 312. This causes the graphical user interface 300 to present a dialog box 700, which includes a number of controls 702 that allow the user to define the structure of the AI/ML model to be produced. Here, the controls 702 allow the user to define the number of symbols that may be identified and the number of samples to be processed and used to identify each symbol. The controls 702 also allow the user to define different activation layers to be used by the AI/ML model. Note that any suitable types of activation layers may be used within an AI/ML model to process signal samples and generate symbol predictions.

After declaring an AI/ML topology using the controls 702, the user may optionally load a pre-trained model of the same architecture, such as from a local file or from a set of models saved externally (such as in the database 106). In some embodiments, each pre-trained model may be saved with a unique state dictionary identifier to help ensure that the pre-trained model matches the number of symbols in saved training data. Otherwise, the device 200 may create an initial AI/ML model having the structure defined using the controls 702. In either case, the user may initiate training of the AI/ML model, such as when the user invokes a "train" function under the "Model" option of the menu 312. This can cause the graphical user interface 300 to present a dialog box 800, an example of which is presented in FIG. 8.

As shown in FIG. 8, the dialog box 800 includes a number of controls 802 that allow the user to specify parameters of the AI/ML model training. In this example, the controls 802 allow the user to define various training hyper-parameters such as the number of training epochs, the learning rate, the training tolerance, and the validation data split percentage to be used during the training. When a "Train Model" control 802 is selected, the device 200 initiates a training loop with the hyper-parameters selected in the dialog box 800, and the device 200 can terminate the training loop when either the maximum number of training epochs has occurred or a desired loss value is reached. Note that numerous AI/ML training processes are known in the art and more are sure to be developed in the future, and this disclosure is not limited to any particular training process. The dialog box 800 also includes a graph 804 that plots the measured loss of the AI/ML model over time during the training, which allows the user to monitor the training process. A dialog box 806 can present the final results of the training of the AI/ML model once the training is completed. After training, the user may select the "Validation" control 802 to evaluate the newly-trained AI/ML model, and the user may select the "Save Model" control 802 to save the newly-trained AI/ML model.

After sufficient training, one or more trained AI/ML models 110 can be saved in the database 106, such as when the user invokes a "save DB" function under the "Model" option of the menu 312. Similarly, one or more pre-trained AI/ML models may be loaded from the database 106, such as when the user invokes a "load DB" function under the "Model" option of the menu 312. In some cases, this may query the stored AI/ML models by network architecture. If two or more stored AI/ML models have identical topologies, the stored AI/ML models may also be queried by their creation date. This process of saving and loading AI/ML models from a database 106 enables highly-trained AI/ML models to be shared, such as among different users or among different applications.

In some embodiments, the device 200 may be used to define a template for feed-forward neural networks or other AI/ML models that receive as input one or more I/Q sample pairs as real floating-point numbers and that output recovered data bits. The AI/ML model that is selected for use may be sized according to the "Marity" (M) of the signal being processed, and two hidden layers may be used with a size of 2(M+1) (Hecht-Nielson). Output symbol labels that are generated by the AI/ML model may have the form of a one-hot vector to ensure that a symbol is selected instead of a probability distribution. For I/Q inputs of size two, for example, one or more AI/ML models may have the following topology. Each AI/ML model may receive I/Q samples (real and imaginary) as inputs, use linear (2×6) and linear (6×M) layers as its activation layers, and output a one-hot vector having a length of M symbols. The AI/ML models can be trained using a mean squared error (MSE) loss function, such as with the AdamW optimizer. After training, the different AI/ML models can be given unique state names based on their specific network topologies (such as the choice of their activation functions) and saved as state dictionaries. Saving AI/ML models as separate state diction- aries may allow users to collect multiple separate models in a single file. The file can be saved internally or externally, such as to the database 106 by pickling the file into a binary format or using any other suitable format. This allows users to train multiple AI/ML models with varying parameters and store the models individually in the same location. Similarly, users can load different pre-trained models by querying them by topology. In some cases, network tools may be used to automatically create a state name for a queried topology, search for a matching topology in the file, and load the weights of the matching topology if found.

Using the graphical user interface 300 shown in FIGS. 7 and 8, one or more users are able to quickly and easily generate and train a number of different AI/ML models based on labeled training data available in the database 106 or elsewhere. This allows the one or more users to quickly and easily create AI/ML models 110 for use in one or more signal processing applications.

FIGS. 9 through 11C illustrate the example graphical user interface 300 supporting the AI/ML auto-labeling function 114 and the symbol correction function 116 in the architec- ture 100 of FIG. 1 according to this disclosure. As shown in FIG. 9, once a trained AI/ML model 110 is available (such as through the training performed by the device 200 as described above or through retrieval of a pretrained model), the user can activate the AI/ML auto-labeling function 114. For example, the user may select the "Auto-Label" control 508 in the graphical user interface 300. The AI/ML auto- labeling function 114 can obtain information regarding one or more signals to be analyzed, and the information can be passed to the trained AI/ML model 110 for symbol predic- tion. The symbol predictions generated by the trained AI/ML model 110 can be identified in the time analysis plot 504 using markers 902. Different markers 902 (such as markers having different shapes, colors, shadings, or other indica- tors) can be used in the time analysis plot 504 to differentiate between different types of symbols predicted by the trained AI/ML model 110. In this example, there are two types of markers 902 to differentiate between two types of symbols, but other numbers of marker types may be used to differ- entiate between other numbers of symbol types (such as up to thirty-two symbol types or even more).

Figure 10:
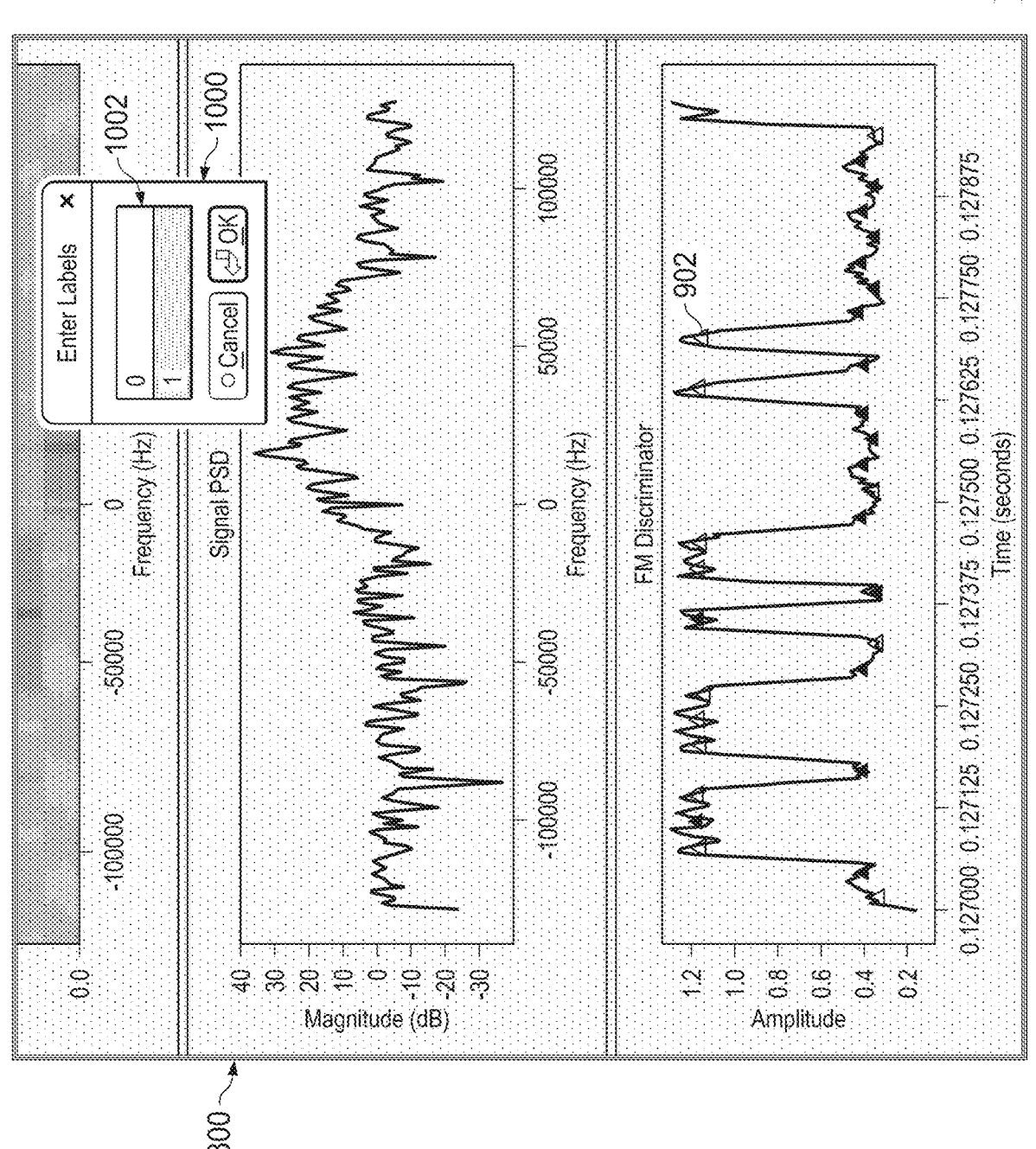

A dialog box 904 may also be presented in the graphical user interface 300 and includes controls 906 and a table 908. The table 908 contains information associated with the predicted symbols that are represented by the generated markers 902. In some cases, the rows of the table 908 may be selectable by the user, and the controls 906 may be used to update or correct the symbol predictions in the selected rows that were generated by the trained AI/ML model 110. The user may also select one of the markers 902 within the time analysis plot 504 (such as when the user double-clicks on the marker 902 in the time analysis plot 504), which presents the user with a dialog box 1000 as shown in FIG. 10. The dialog box 1000 includes controls 1002 that allow the user to change the symbol label associated with the selected marker 902. Either approach allows the user to correct any inaccurate symbol predictions generated by the trained AI/ML model 110.

Figure 11A:
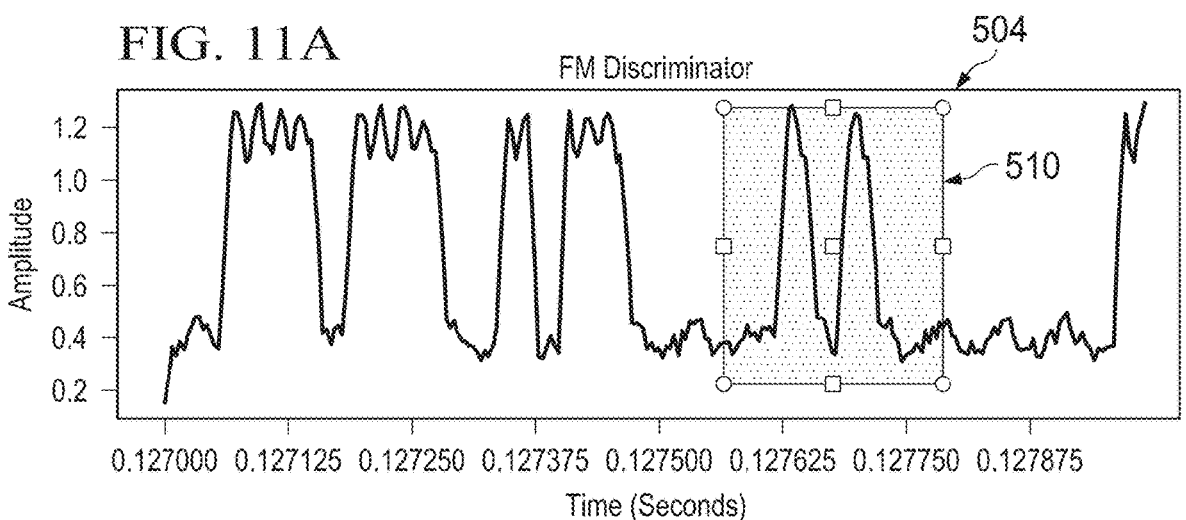
Figure 11B:
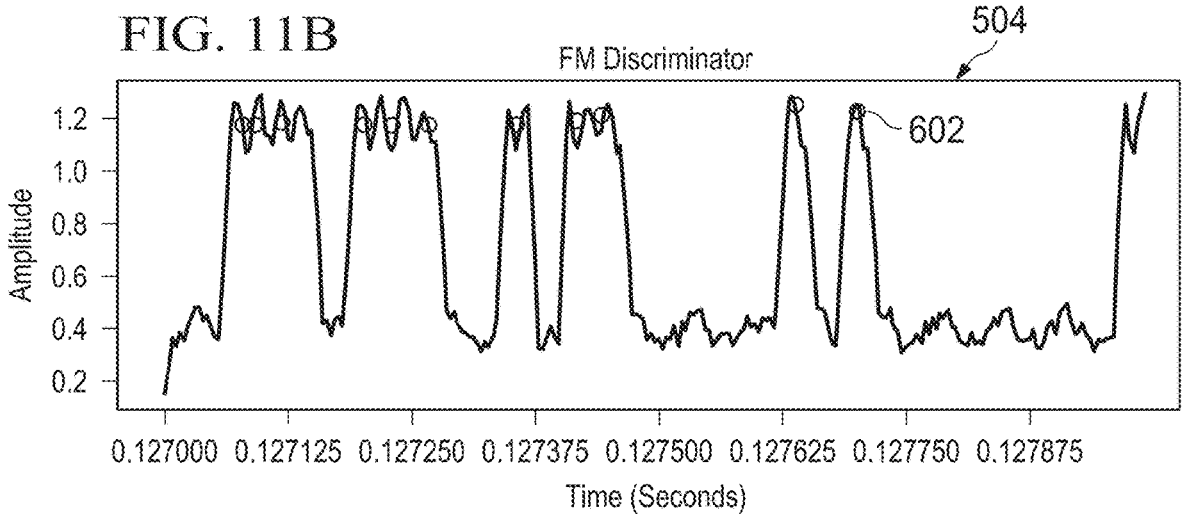
Figure 11C:
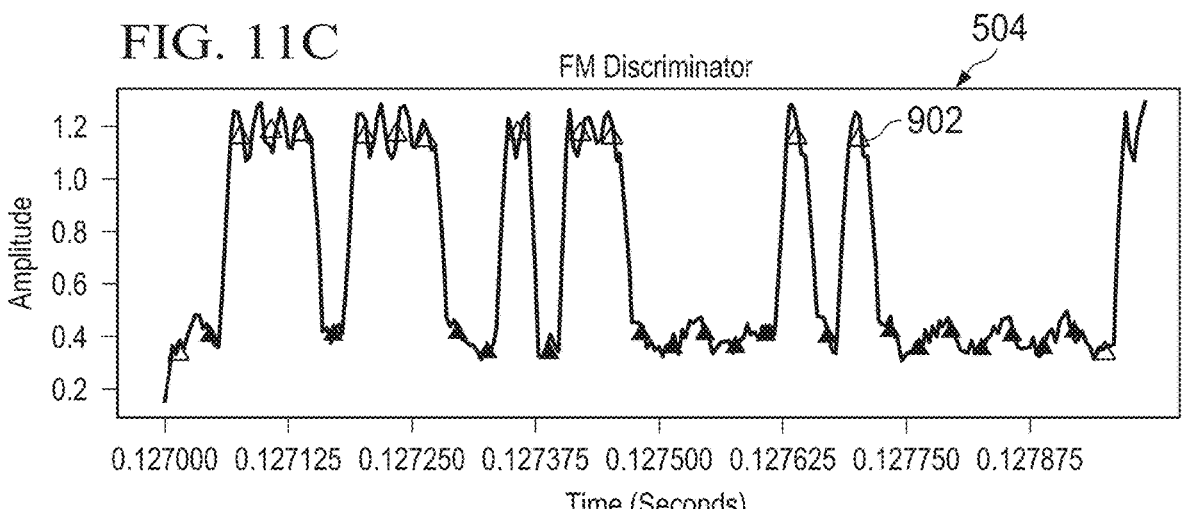

FIGS. 11A through 11C illustrate how the time analysis plot 504 can be modified over time during use of the graphical user interface 300. In FIG. 11A, the time analysis plot 504 is associated with the boundary 310 defined by the user in the spectrogram window 302, and the user may optionally define a boundary 510 within the time analysis plot 504 to view the selected portion of the time analysis plot 504 in a larger view. In FIG. 11B, the markers 602 have been added to the time analysis plot 504 based on locations selected by the user, where each marker 602 can have an associated label defined by the user. In FIG. 11C, the markers 902 have been added to the time analysis plot 504 based on symbol predictions generated by the trained AI/ML model 110. If necessary, one or more of the markers 902 can be selected by the user and updated to have a corrected symbol label.

In some embodiments, the AI/ML auto-labeling function 114 takes I/Q samples in the current time slice used to generate the current time analysis plot 504 being displayed in the graphical user interface 300, and these I/Q samples are passed to a trained AI/ML model 110. If there are multiple samples per symbol, the trained AI/ML model 110 may decimate the I/Q samples, such as down to one sample per symbol, and make symbol predictions using the decimated samples. The input data can be appended to a label array for storage along with the predicted symbol labels. The symbol predictions are also overlaid as the markers 902 on the time analysis plot 504, and each marker 902 may be drawn at the closest matching coordinates in the time analysis plot 504. If there are multiple samples per symbol, the markers 902 may not exactly intersect the (x, y) coordinates of the symbols in the time analysis plot 504 due to the decimation. If the user selects a specific marker 902 for correction, the user can enter the corrected symbol label, and the time analysis plot 504 can be updated to include the corrected symbol label.

FIG. 12 illustrates an example documentation feature of the graphical user interface 300 supporting the architecture 100 of FIG. 1 according to this disclosure. As shown in FIG. 12, if needed or desired, the user can select the "Help" option of the menu 312 in the graphical user interface 300. This can present a dialog box 1200 to the user, where the dialog box 1200 contains information that may be useful to the user. For example, the dialog box 1200 may include text that assists the user in understanding the internal workings and functionality of the architecture 100 or that explains certain inputs or outputs of the architecture 100.

Figure 13:
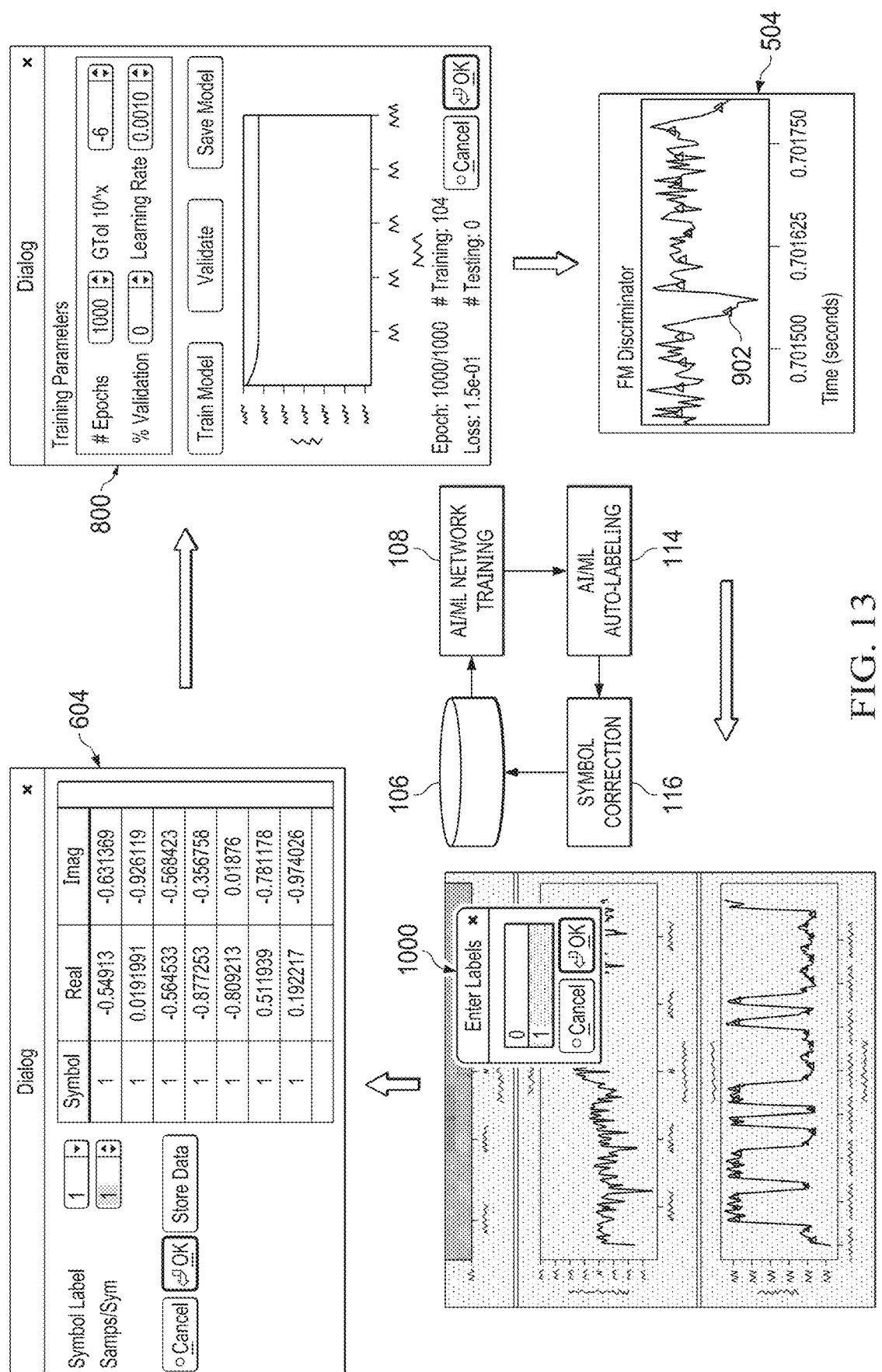
FIG. 13 illustrates an example iterative process that may occur using a graphical user interface supporting the architecture of FIG. 1 according to this disclosure.

FIG. 13 illustrates an example iterative process 1300 that may occur using the graphical user interface 300 supporting the architecture 100 of FIG. 1 according to this disclosure. As shown in FIG. 13, the graphical user interface 300 allows one or more users to obtain training data, train an AI/ML model, perform auto-labeling using the trained AI/ML model, and correct any misidentified symbols produced by the trained AI/ML model. The corrections to the misidentified symbols can be fed back as additional training data, which allows for retraining of the AI/ML model, performance of auto-labeling using the retrained AI/ML model, and correction of any additional misidentified symbols produced by the retrained AI/ML model.

Through a sequence of iteratively auto-labelling, correcting, storing, and training, one or more users can quickly and easily build trained AI/ML models 110 and large labeled datasets 112 using the graphical user interface 300. This can be accomplished with minimal user knowledge of the underlying AI/ML frameworks. The trained models 110 and labeled datasets 112 can be saved externally or to a dedicated database (such as the database 106) for later use in SIGINT applications or other suitable applications.

Although FIGS. 3 through 13 illustrate one example of a graphical user interface 300 for AI/ML cognitive signals analysis, various changes may be made to FIGS. 3 through 13. For example, any other suitable input and output mechanisms may be used to provide information to and receive information from one or more users of the graphical user interface 300. Also, the graphical user interface 300 is often described as being used to support the identification of two symbols (represented as zero and one). However, AI/ML models 110 and labeled datasets 112 may be generated for other numbers of symbols, such as up to thirty-two or more symbols. In addition, the AI/ML models 110 may be trained to perform functions in addition to symbol identification, such as carrier estimation, symbol rate estimation, and FHSS channel.

The following describes example embodiments of this disclosure that implement or relate to graphical user interfaces for AI/ML cognitive signals analysis. However, other embodiments may be used in accordance with the teachings of this disclosure.

In a first embodiment, a method includes graphically presenting information defining one or more signals in a graphical user interface. The method also includes receiving, via the graphical user interface, an identification of (i) portions of the information defining the one or more signals that are associated with symbols contained in the one or more signals and (ii) labels for the symbols. The method further includes storing the identified portions of the information defining the one or more signals and the identified labels for the symbols as training data. In addition, the method includes receiving, via the graphical user interface, an identification of an AI/ML model and training the AI/ML model to predict the symbols using the training data.

In a second embodiment, an apparatus includes at least one processing device configured to initiate graphical presentation of information defining one or more signals in a graphical user interface. The at least one processing device is also configured to receive, via the graphical user interface, an identification of (i) portions of the information defining the one or more signals that are associated with symbols contained in the one or more signals and (ii) labels for the symbols. The at least one processing device is further configured to initiate storage of the identified portions of the information defining the one or more signals and the identified labels for the symbols as training data. In addition, the at least one processing device is configured to receive, via the graphical user interface, an identification of an AI/ML model and train the AI/ML model to predict the symbols using the training data.

In a third embodiment, a non-transitory computer readable medium contains instructions that when executed cause at least one processor to initiate graphical presentation of information defining one or more signals in a graphical user interface. The medium also contains instructions that when executed cause the at least one processor to receive, via the graphical user interface, an identification of (i) portions of the information defining the one or more signals that are associated with symbols contained in the one or more signals and (ii) labels for the symbols. The medium further contains instructions that when executed cause the at least one processor to initiate storage of the identified portions of the information defining the one or more signals and the identified labels for the symbols as training data. In addition, the medium contains instructions that when executed cause the at least one processor to receive, via the graphical user interface, an identification of an AI/ML model and train the AI/ML model to predict the symbols using the training data.

Any single one or any suitable combination of the following features may be used with the first, second, or third embodiment. The trained AI/ML model may be applied to at least part of the information defining the one or more signals or additional information defining one or more additional signals in order to generate symbol predictions, the symbol predictions may be presented via the graphical user interface, and one or more corrections to one or more of the symbol predictions may be received via the graphical user interface. The training data may be updated with the one or more corrections to the one or more symbol predictions, and/or the AI/ML model may be retrained using the updated training data. The information defining the one or more signals may include spectrographic information, the identification of the portions of the information defining the one or more signals may include a selection of a point in the spectrographic information, the graphical user interface may include frequency and time analysis plots associated with the selected point in the spectrographic information, and the labels for the symbols may be identified within at least one of the analysis plots based on user input received via the graphical user interface. The identification of the AI/ML model may include receiving a structure of the AI/ML model via the graphical user interface, and the structure of the AI/ML model may be defined from a set of pre-defined building blocks. Training parameters associated with the AI/ML model may be received via the graphical user interface, and the AI/ML model may be trained based on the training parameters. A status of the training of the AI/ML model and a result of the training of the AI/ML model may be provided via the graphical user interface. For each of multiple AI/ML models, symbol predictions may be generated using the AI/ML model, one or more corrections to the symbol predictions may be received via the graphical user interface, the one or more corrections may be stored as updated training data, and the AI/ML model may be retrained using the updated training data iteratively.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   graphically presenting information defining one or more signals in a graphical user interface;
   receiving, via the graphical user interface, an identification of (i) portions of the information defining the one or more signals that are associated with symbols contained in the one or more signals and (ii) labels for the symbols, wherein the symbols contained in the one or more signals are used to recover data associated with the one or more signals;
   storing the identified portions of the information defining the one or more signals and the identified labels for the symbols as training data;
   receiving, via the graphical user interface, an identification of an artificial intelligence/machine learning (AI/ML) model; and
   training the AI/ML model to predict the symbols using the training data.

2. The method of claim 1, further comprising:
   applying the trained AI/ML model to at least part of the information defining the one or more signals or additional information defining one or more additional signals in order to generate symbol predictions;
   presenting, via the graphical user interface, the symbol predictions; and
   receiving, via the graphical user interface, one or more corrections to one or more of the symbol predictions.

3. The method of claim 2, further comprising at least one of:
   updating the training data with the one or more corrections to the one or more symbol predictions; and
   retraining the AI/ML model using the updated training data.

4. The method of claim 2, wherein:
   the information defining the one or more signals comprises spectrographic information;

the identification of the portions of the information defining the one or more signals comprises a selection of a point in the spectrographic information;

the graphical user interface comprises frequency and time analysis plots associated with the selected point in the spectrographic information; and the labels for the symbols are identified within at least one of the analysis plots based on user input received via the graphical user interface.

5. The method of claim 1, wherein:

receiving the identification of the AI/ML model comprises receiving, via the graphical user interface, a structure of the AI/ML model; and the structure of the AI/ML model is defined from a set of pre-defined building blocks.

6. The method of claim 1, further comprising:

receiving, via the graphical user interface, training parameters associated with the AI/ML model, wherein training the AI/ML model comprises training the AI/ML model based on the training parameters; and providing, via the graphical user interface, a status of the training of the AI/ML model and a result of the training of the AI/ML model.

7. The method of claim 1, further comprising, for each of multiple AI/ML models, iteratively:

generating symbol predictions using the AI/ML model;

receiving, via the graphical user interface, one or more corrections to the symbol predictions;

storing the one or more corrections as updated training data; and retraining the AI/ML model using the updated training data.

8. The method of claim 1, wherein:

the one or more signals represent one or more first signals;

the symbols represent a first set of symbols;

the training data includes the first set of symbols;

the AI/ML model is trained using the training data including the first set of symbols; and the method further comprises:

receiving one or more second signals containing a second set of symbols; and predicting the second set of symbols using the AI/ML model trained via the training data including the first set of symbols.

9. An apparatus comprising:

at least one processing device configured to:

initiate graphical presentation of information defining one or more signals in a graphical user interface;

receive, via the graphical user interface, an identification of (i) portions of the information defining the one or more signals that are associated with symbols contained in the one or more signals and (ii) labels for the symbols, wherein the symbols contained in the one or more signals are used to recover data associated with the one or more signals;

initiate storage of the identified portions of the information defining the one or more signals and the identified labels for the symbols as training data;

receive, via the graphical user interface, an identification of an artificial intelligence/machine learning (AI/ML) model; and train the AI/ML model to predict the symbols using the training data.

10. The apparatus of claim 9, wherein the at least one processing device is further configured to:

apply the trained AI/ML model to at least part of the information defining the one or more signals or additional information defining one or more additional signals in order to generate symbol predictions;

initiate presentation, via the graphical user interface, of the symbol predictions; and receive, via the graphical user interface, one or more corrections to one or more of the symbol predictions.

11. The apparatus of claim 10, wherein the at least one processing device is further configured to at least one of:

update the training data with the one or more corrections to the one or more symbol predictions; and retrain the AI/ML model using the updated training data.

12. The apparatus of claim 10, wherein:

the information defining the one or more signals comprises spectrographic information;

the identification of the portions of the information defining the one or more signals comprises a selection of a point in the spectrographic information;

the graphical user interface comprises frequency and time analysis plots associated with the selected point in the spectrographic information; and the labels for the symbols are identified within at least one of the analysis plots based on user input received via the graphical user interface.

13. The apparatus of claim 9, wherein:

to receive the identification of the AI/ML model, the at least one processing device is configured to receive, via the graphical user interface, a structure of the AI/ML model; and the structure of the AI/ML model is defined from a set of pre-defined building blocks.

14. The apparatus of claim 9, wherein the at least one processing device is further configured to:

receive, via the graphical user interface, training parameters associated with the AI/ML model, wherein the at least one processing device is configured to train the AI/ML model based on the training parameters; and provide, via the graphical user interface, a status of the training of the AI/ML model and a result of the training of the AI/ML model.

15. The apparatus of claim 9, wherein the at least one processing device is further configured, for each of multiple AI/ML models, to iteratively:

generate symbol predictions using the AI/ML model;

receive, via the graphical user interface, one or more corrections to the symbol predictions;

initiate storage of the one or more corrections as updated training data; and retrain the AI/ML model using the updated training data.

16. A non-transitory computer readable medium containing instructions that when executed cause at least one processor to:

initiate graphical presentation of information defining one or more signals in a graphical user interface;

receive, via the graphical user interface, an identification of (i) portions of the information defining the one or more signals that are associated with symbols contained in the one or more signals and (ii) labels for the symbols, wherein the symbols contained in the one or more signals are used to recover data associated with the one or more signals;

initiate storage of the identified portions of the information defining the one or more signals and the identified labels for the symbols as training data;

receive, via the graphical user interface, an identification of an artificial intelligence/machine learning (AI/ML) model; and train the AI/ML model to predict the symbols using the training data.

17. The non-transitory computer readable medium of claim 16, further containing instructions that when executed cause the at least one processor to:

apply the trained AI/ML model to at least part of the information defining the one or more signals or additional information defining one or more additional signals in order to generate symbol predictions;

initiate presentation, via the graphical user interface, of the symbol predictions; and receive, via the graphical user interface, one or more corrections to one or more of the symbol predictions.

18. The non-transitory computer readable medium of claim 17, further containing instructions that when executed cause the at least one processor to at least one of:

update the training data with the one or more corrections to the one or more symbol predictions; and retrain the AI/ML model using the updated training data.

19. The non-transitory computer readable medium of claim 17, wherein:

the information defining the one or more signals comprises spectrographic information;

the identification of the portions of the information defining the one or more signals comprises a selection of a point in the spectrographic information;

the graphical user interface comprises frequency and time analysis plots associated with the selected point in the spectrographic information; and the labels for the symbols are identified within at least one of the analysis plots based on user input received via the graphical user interface.

20. The non-transitory computer readable medium of claim 16, wherein:

the instructions that when executed cause the at least one processor to receive the identification of the AI/ML model comprise:

instructions that when executed cause the at least one processor to receive, via the graphical user interface, a structure of the AI/ML model; and the structure of the AI/ML model is defined from a set of pre-defined building blocks.

\* \* \* \* \*